(12) United States Patent
Iwane et al.

(10) Patent No.: US 6,518,649 B1
(45) Date of Patent: Feb. 11, 2003

(54) TAPE CARRIER TYPE SEMICONDUCTOR DEVICE WITH GOLD/GOLD BONDING OF LEADS TO BUMPS

(75) Inventors: Tomohiko Iwane, Tenri (JP); Kenji Toyosawa, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/714,213

(22) Filed: Nov. 17, 2000

(30) Foreign Application Priority Data

Dec. 20, 1999 (JP) ............................................ 11-361633

(51) Int. Cl.[7] ...................... H01L 23/50; H01L 23/48; H01L 29/40; H01L 23/52; B32B 3/00

(52) U.S. Cl. ................... 257/668; 257/666; 257/673; 257/698; 257/772; 257/779; 257/766; 257/780; 257/786; 257/767; 257/762; 257/690; 257/692; 257/693

(58) Field of Search ................ 257/668, 666, 257/673, 696, 698, 692, 693, 687, 678, 690, 762, 767, 772, 779, 766, 780, 784, 786

(56) References Cited

U.S. PATENT DOCUMENTS

| | | | |
|---|---|---|---|
| 4,263,606 A | * | 4/1981 | Yorikane |
| 4,676,864 A | * | 6/1987 | Maeda et al. ............... 156/633 |
| 4,786,545 A | * | 11/1988 | Sakuma et al. ............. 428/209 |
| 4,963,974 A | * | 10/1990 | Ushio et al. ................ 428/601 |
| 5,049,718 A | * | 9/1991 | Spletter et al. ........ 219/121.64 |
| 5,060,052 A | * | 10/1991 | Casto et al. ................ 361/393 |
| 5,132,772 A | * | 7/1992 | Fetty |
| 5,139,610 A | * | 8/1992 | Dunaway et al. ........... 156/656 |
| 5,384,204 A | * | 1/1995 | Yumoto et al. ............. 257/677 |
| 5,844,304 A | * | 12/1998 | Kata et al. .................. 257/620 |
| 5,910,685 A | * | 6/1999 | Watanabe et al. .......... 257/777 |
| 6,028,011 A | * | 2/2000 | Takase et al. ............... 438/745 |
| 6,175,151 B1 | * | 1/2001 | Hashimoto ................... 257/668 |
| 6,262,488 B1 | * | 7/2001 | Masayuki et al. .......... 257/673 |
| 6,297,142 B1 | * | 10/2001 | Mita et al. .................. 438/612 |
| 2001/0002066 A1 | * | 5/2001 | Mita et al. .................. 257/673 |
| 2001/0040290 A1 | * | 11/2001 | Sakurai et al. .............. 257/737 |
| 2001/0054751 A1 | * | 12/2001 | Toyosawa ................... 257/668 |

FOREIGN PATENT DOCUMENTS

| | | | | |
|---|---|---|---|---|
| JP | 63-65633 | * | 3/1988 | .................. 29/827 |
| JP | 63-133639 | * | 6/1988 | .................. 438/614 |
| JP | 2-216842 | * | 8/1990 | |
| JP | 4-196450 | * | 7/1992 | |
| JP | 6-77232 | * | 3/1994 | .................. 257/737 |

* cited by examiner

Primary Examiner—Alexander O. Williams
(74) Attorney, Agent, or Firm—Nixon & Vanderhye P.C.

(57) ABSTRACT

The interconnect pattern of the tape carrier in a COF is gold plated other than the part covered by solder resists. The inner leads of the tape carrier and the corresponding gold bumps of electrodes of the semiconductor chip are thermally compressed so that the inner leads penetrate into the gold bumps, thus creating gold-gold compression bonding.

13 Claims, 3 Drawing Sheets

US 6,518,649 B1

TAPE CARRIER TYPE SEMICONDUCTOR DEVICE WITH GOLD/GOLD BONDING OF LEADS TO BUMPS

BACKGROUND OF THE INVENTION (1) Field of the Invention

The present invention relates to a tape carrier type semiconductor device in which a semiconductor chip having bumps formed therewith is mounted by bonding as well as relating to a fabrication method thereof and a liquid crystal module using the same, and in particular relates to a tape carrier type semiconductor device in which the bonded chip surface is covered by a tape substrate.

(2) Description of the Prior Art

Conventionally, semiconductor devices called COF (Chip On Film) in which semiconductor chips are mounted by bonding on a tape-like flexible interconnect substrate(tape carrier) have been known. FIG. 1 is a sectional view showing a conventional COF configuration, which will be described next.

A COF 25 has a semiconductor chip 1 mounted by bonding to a tape carrier 26, as described above. Formed on the obverse surface of semiconductor chip 1 are gold bumps 3. Tape carrier 26 has a copper interconnect pattern 4 formed on a tape substrate 7 of polyimide or the like. Solder resists 10 are formed in part over tape substrate 7 and interconnect pattern 4. Interconnect pattern 4 includes inner leads 14 to be bonded to gold bumps 3 of semiconductor chip 1 and outer leads 13 and element mounting patterns. Exposed parts of inner leads 14, uncovered with solder resists 10, are metalized by tin plating 8 while the element mounting patterns and outer leads 13 are metalized by gold plating 6.

FIG. 2 is an enlarged view showing the joined part of semiconductor chip 1 and tape carrier 26. As shown in FIG. 2, gold bump 3 is formed on an electrode 2 of semiconductor chip 1. Tin plating 8 of inner lead 14 and gold bump 3 are bonded by formation of eutectic alloy 9 therefrom. The obverse face of semiconductor chip 1 is totally covered by tape substrate 7 with bumps 3 and inner leads 14 bonded. The bonded part of semiconductor chip 1 and tape carrier 26 is sealed with a resin 11.

In fabrication of COF 25, semiconductor chips 1 are provided and mounted on long tape carrier 26 at regular intervals along the longitudinal direction of the tape. The mounting method in this case is carried out by, as shown in FIG. 2, heating tin plating 8 of interconnect pattern 4 of tape carrier 26 and gold bump 3 of each electrode of semiconductor chip 1, from the reverse face (opposite side of the bump forming surface) of semiconductor chip 1 whilst pressing tape carrier 26, from the reverse face of interconnect pattern 4, to bond them by formation of gold-tin eutectic alloy 9, as stated above.

Connection of the chip to outer leads 13 is made by thermocompression bonding, mainly using ACF(anisotropic conductive film or adhesives) or by bonding with solder. To meet the user demand for gold plated connector connection specification, two separate plating treatments using two kinds of metals needed to be carried out, that is, the outer lead part alone needed to be gold plated in the second stage. The two separate plating fabrication process for tape carriers is carried out first by etching a copper foil tape carrier so as to form an interconnect pattern, applying solder resists, and tin plating. Then, part of interconnect pattern 4 (corresponding to inner leads 14) to be bonded to semiconductor chip 1 is covered with masks for interconnect pattern protection to remove tin plating 8 from the exposed part. After the removal of tin plating 8, the part is gold plated. After completion of the plating process, the masks for interconnect pattern protection is removed and the obtained carrier is inspected for shipment.

In the present situation of tape carrier fabrication, the specifications of the tape carrier, i.e., COF 25, is custom made to deal with user's requests. COF 25 is mainly used for cellular phones, at present. As to joining methods of the outer leads, demands for contact-type connections such as spring connectors and elastomeric connectors increase in place of that for ACF bonding and solder bonding. For the contact type, the tin plating configuration of outer leads 13 in interconnect pattern 4 will cause a contact problem, so the outer leads are requested to be gold plated. To deal with such requests, tin plating 8 on tape carrier interconnect pattern 4 and gold bumps 3 on electrodes 2 of semiconductor chip 1 have been bonded by using a conventional bonding process, i.e., gold-tin eutectic alloy forming process, while outer leads 13 to be joined by connectors were alone gold plated using a two separate plating process using two kinds of metals. However, this process is not good enough since it needs 30 to 50% more cost for the fabrication, resulting in increase in price.

Further, pattern disconnection problems have also occurred during the tin plating process of interconnect pattern 4 of tape carrier 26 of COF 25. That is, after etching copper foil tape carrier 26 to form an interconnect pattern 4, part of interconnect pattern 4 other than the connecting portion is covered by solder resists 10 and the exposed part of the pattern is subjected to tin plating 8. In this case, as shown in FIG. 3, during tin plating after deposition of solder resists 10, interconnect pattern 4 is excised at the edge of the resist 10 deposition, producing hollowness 12 in interconnect pattern 4 (or causing interconnect pattern 4 to be thinned by excessive substitutional plating). This effect significantly affected the reliability and induced defects which lead to disconnection after some tens of cycles in the thermal cycling test. This drawback can be made up for by thickening the lines of interconnect pattern 4, but this method needs a greater tape area for COF 25, hence increases the cost, without providing any essential solution.

SUMMARY OF THE INVENTION

It is therefore an object of the present invention to provide a tape carrier type semiconductor device which uses gold plating for the outer leads without raising its cost and can prevent occurrence of hollowness in the interconnect pattern therein and hence presents a high reliability, as well as providing a fabrication method thereof and a liquid crystal module using the device.

In order to achieve the above object, the present invention is configured as follows:

In accordance with the first aspect of the present invention, a tape carrier type semiconductor device includes: a semiconductor chip having connecting bumps formed on the obverse side thereof; and a tape carrier composed of a tape substrate and an interconnect pattern, including connecting inner leads, formed on a tape substrate, the obverse side of the semiconductor chip being totally covered by the tape substrate while the bumps and the inner leads are bonded to each other, and is characterized in that the bumps are made up of gold and the inner leads are gold plated so that the gold bumps and inner leads are thermally compression-bonded whereby the inner leads penetrate into corresponding gold bumps to create bonding.

In accordance with the second aspect of the present invention, the tape carrier type semiconductor device having the above first feature is characterized in that the inner leads are formed by plating nickel as an undercoating over the copper interconnections and subsequently plating gold over the nickel plating.

In accordance with the third aspect of the present invention, the tape carrier type semiconductor device having the above second feature is characterized in that the thickness of the nickel plating ranges from 0.1 to 1.0 $\mu$m and the thickness of the gold plating ranges from 0.05 to 3.0 $\mu$m.

In accordance with the fourth aspect of the present invention, the tape carrier type semiconductor device having the above first or second feature is characterized in that solder resists are formed in part on the tape carrier and the interconnect pattern other than that covered by the solder resists is gold plated.

In accordance with the fifth aspect of the present invention, the tape carrier type semiconductor device having the above first or second feature is characterized in that the space between the semiconductor chip and the tape carrier is filled up with a resin so as to encapsulate the bonded portion of the semiconductor chip and the tape carrier.

In accordance with the sixth aspect of the present invention, the tape carrier type semiconductor device having the above first or second feature is characterized in that the portions of the inner leads which are to be thermally compression-bonded and connected to the gold bumps have a width of 10 to 35 $\mu$m.

In accordance with the seventh aspect of the present invention, a fabrication method for producing a tape carrier type semiconductor device, includes: a semiconductor chip having connecting bumps formed on the obverse side thereof; and a tape carrier composed of a tape substrate and an interconnect pattern, including connecting inner leads, formed on a tape substrate, the obverse side of the semiconductor chip being totally covered by the tape substrate while the bumps and the inner leads are bonded to each other, wherein the bumps are made up of gold and the inner leads are gold plated so that the gold bumps and inner leads are thermally compression-bonded whereby the inner leads penetrate into corresponding gold bumps to create bonding, and is characterized in that the bonding portions of the gold bumps and the inner leads is carried out by heating the semiconductor chip from the reverse face thereof at a temperature of 400 to 450° C. while pressing the reverse face of the tape carrier perpendicularly to the semiconductor chip's obverse face with a pressing force of 0.1 to 0.3 N per bump for a compressing time of 1 to 3 seconds.

In accordance with the eighth aspect of the present invention, the fabrication method of a tape carrier type semiconductor device having the above seventh feature is characterized in that the inner leads are formed by plating nickel as an undercoating over the copper interconnections and subsequently plating gold over the nickel plating.

In accordance with the ninth aspect of the present invention, a liquid crystal module which is connected to a tape carrier type semiconductor device which comprises: a semiconductor chip having connecting bumps formed on the obverse side thereof; and a tape carrier composed of a tape substrate and an interconnect pattern, including connecting inner leads, formed on a tape substrate, the obverse side of the semiconductor chip being totally covered by the tape substrate while the bumps and the inner leads are bonded to each other, wherein the bumps are made up of gold and the inner leads are gold plated so that the gold bumps and inner leads are thermally compression-bonded whereby the inner leads penetrate into corresponding gold bumps to create bonding.

In accordance with the tenth aspect of the present invention, the liquid crystal module having the above ninth feature is characterized by the connected tape carrier type semiconductor device wherein the inner leads are formed by plating nickel as an undercoating over the copper interconnections and subsequently plating gold over the nickel plating.

In accordance with the eleventh aspect of the present invention, the liquid crystal module having the above ninth feature is characterized by the connected tape carrier type semiconductor device wherein the inner leads are formed by plating nickel as an undercoating over the copper interconnections and subsequently plating gold over the nickel plating and that the thickness of the nickel plating ranges from 0.1 to 1.0 $\mu$m and the thickness of the gold plating ranges from 0.05 to 3.0 $\mu$m.

In accordance with the twelfth aspect of the present invention, the liquid crystal module having the above ninth feature is characterized by the connected tape carrier type semiconductor device wherein solder resists are formed in part on the tape carrier and the interconnect pattern other than that covered by the solder resists is gold plated.

In accordance with the thirteenth aspect of the present invention, the liquid crystal module having the above ninth feature is characterized by the connected tape carrier type semiconductor device wherein the inner leads are formed by plating nickel as an undercoating over the copper interconnections and subsequently plating gold over the nickel plating and that solder resists are formed in part on the tape carrier and the interconnect pattern other than that covered by the solder resists is gold plated.

In accordance with the fourteenth aspect of the present invention, the liquid crystal module having the above ninth feature is characterized by the connected tape carrier type semiconductor device wherein the space between the semiconductor chip and the tape carrier is filled up with a resin so as to encapsulate the bonded portion of the semiconductor chip and the tape carrier.

In accordance with the fifteenth aspect of the present invention, the liquid crystal module having the above ninth feature is characterized by the connected tape carrier type semiconductor device wherein the inner leads are formed by plating nickel as an undercoating over the copper interconnections and subsequently plating gold over the nickel plating and that the space between the semiconductor chip and the tape carrier is filled up with a resin so as to encapsulate the bonded portion of the semiconductor chip and the tape carrier.

In accordance with the sixteenth aspect of the present invention, the liquid crystal module having the above ninth feature is characterized by the connected tape carrier type semiconductor device wherein the portions of the inner leads which are to be thermally compression-bonded and connected to the gold bumps have a width of 10 to 35 $\mu$m.

In accordance with the seventeenth aspect of the present invention, the liquid crystal module having the above ninth feature is characterized by the connected tape carrier type semiconductor device wherein the inner leads are formed by plating nickel as an undercoating over the copper interconnections and subsequently plating gold over the nickel plating and that the portions of the inner leads which are to be thermally compression-bonded and connected to the gold bumps have a width of 10 to 35 $\mu$m.

As described above, there are various demands for specifications of COFs depending on the usage. In order to deal with the demands for the specifications in which the outer leads should be gold plated, first the tape carrier with copper foil thereon is etched to create an interconnect pattern. Then, after application of solder resists over the pattern, the inner leads, outer leads and element mounting portions, that is, the areas with no solder resist, are totally gold plated. The outer leads are entirely gold plated so that they can be connected to the connectors while the electrodes of the semiconductor chip and the interconnect pattern of the tape carrier are thermally compressed by a heating tool from over the tape carrier so as to create thermal compression bonding between the gold bumps of the electrodes and the gold plated leads of the interconnect pattern. Since this process is of thermal compression bonding, heating is implemented from the semiconductor chip's reverse face (the surface opposite to the bump forming surface), to avoid heating from the tape carrier side. Further, for the bonding portion, the inner leads are specified to be narrow so that the inner leads can penetrates into the corresponding gold bumps. In this way, gold-gold bonding is made possible by modifying the heating and pressing conditions for the conventional gold-tin eutectic alloy bonding, thus enabling gold-gold bonding.

DESCRIPTION OF THE PREFERRED EMBODIMENTS

The embodiment of the present invention will hereinafter be described with reference to the accompanying drawings.

Figure 1:
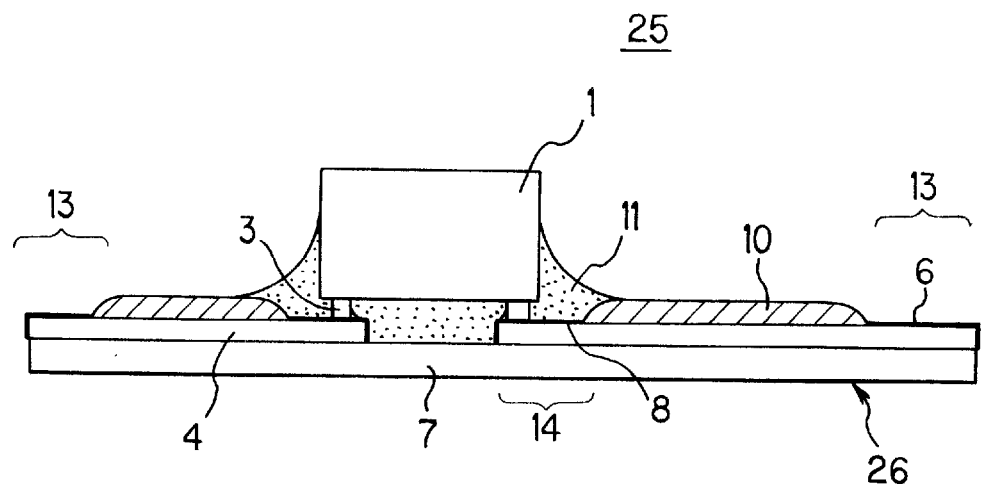
FIG. 1 is a sectional view showing a configuration of a conventional COF.
Figure 2:
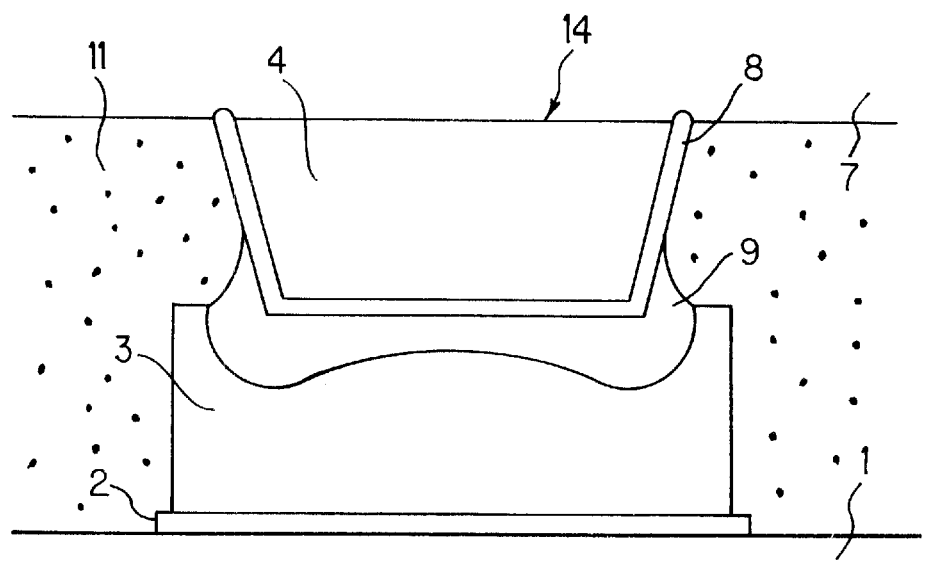
FIG. 2 is an enlarged sectional view showing the joined portion of a semiconductor chip to a tape carrier in a conventional COF.
Figure 3:
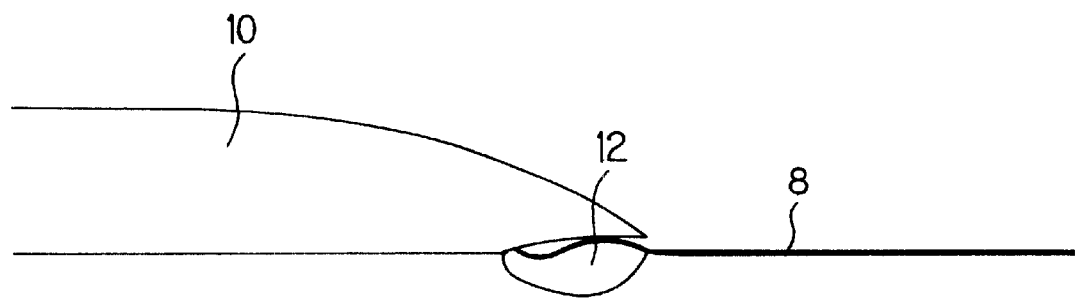
FIG. 3 is a sectional view showing a hollowed state in an interconnect pattern.
Figure 4:
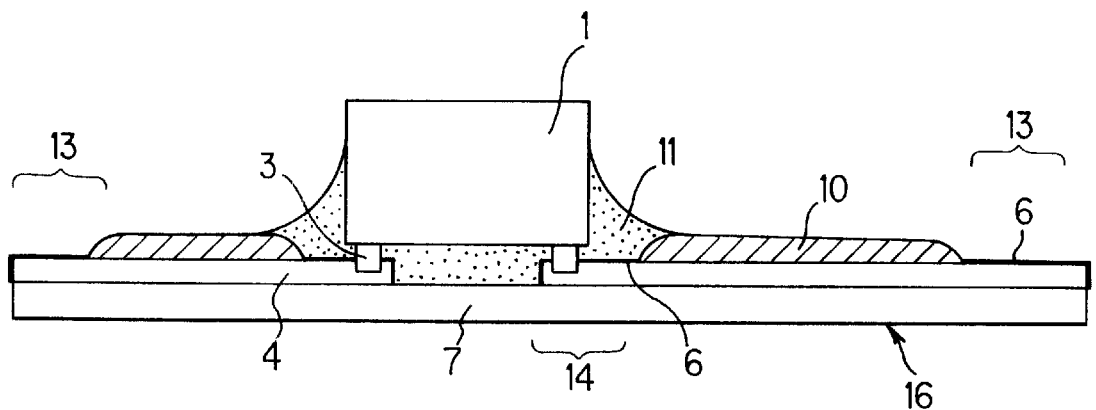
FIG. 4 is a sectional view showing a configuration of a tape carrier type semiconductor device (COF) in accordance with the present invention.
Figure 5:
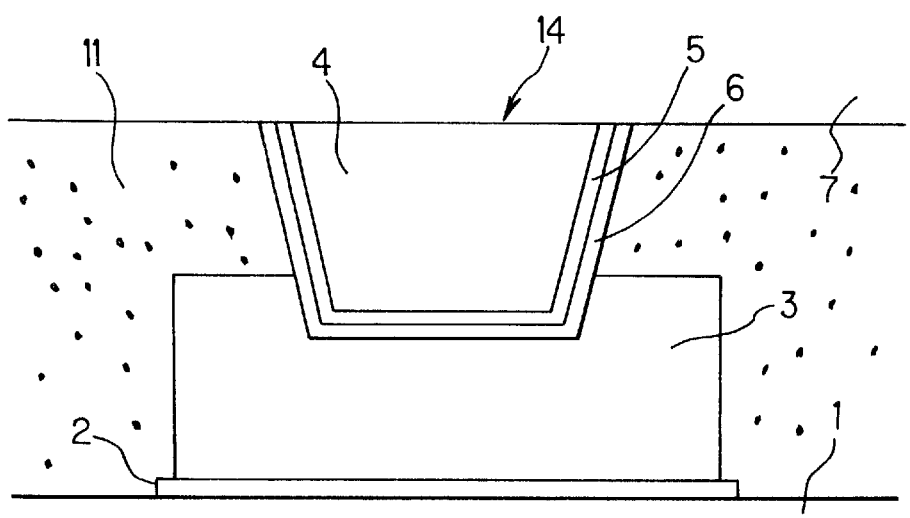
FIG. 5 is an enlarged sectional view showing the joined portion of a semiconductor chip to a tape carrier in a COF of the present invention.

FIG. 4 is a sectional view showing a configuration of a tape carrier type semiconductor device in accordance with the present invention. FIG. 5 is an enlarged sectional view showing the joined portion of a semiconductor chip to a tape carrier in a COF of the present invention. In FIGS. 4 and 5, the same components as in FIGS. 1 and 2 are allotted with the same reference numerals.

COF 15 differs from the conventional configuration in that gold plating 6 is deposited on interconnect pattern 4 of tape carrier 16 in the areas where no solder resist 10 is covered. Accordingly, inner leads 14 of tape carrier 16 and gold bumps 3 of electrodes 2 of semiconductor chip 1 are thermally compressed to each other so that each inner lead 14 penetrates into the corresponding gold bump 3, thus forming a gold-gold compression bond.

Next, each component will be described in detail. Tape substrate 7 is an insulating member of polyimides having a thickness of 12.5 $\mu$m to 75 $\mu$m with copper foil pattern 4 of 9 $\mu$m to 18 $\mu$m thick applied thereon without adhesives (when polyimide substrate is 75 $\mu$m thick, the temperature for bonding the semiconductor chip should be set higher).

Formed on the copper foil pattern is nickel plating 5 of 0.1 to 1.0 $\mu$m thick, on which gold plating 6 of 0.05 to 3.0 $\mu$m thick is implemented (as to the thickness of gold plating, it was confirmed that flash gold plating of 0.05 $\mu$m thick was adequate to create the connection). Specifications relating to the thickness were determined because gold plating of lower than 0.05 $\mu$m thick might cause bonding failures while gold plating in excess of 3 $\mu$m thick raises the cost too high. The reason why nickel plating 5 is provided under gold plating 6 is to prevent metallic interdiffusion between gold and copper.

Each outer lead electrode 2 of semiconductor chip 1 is formed with a gold projected electrode (referred to as bump 3). The semiconductor chip is positioned so that its bumps 3 oppose the pattern surface of tape carrier 16. In this state, the structure is heated at 400 to 450° C. from the semiconductor chip's reverse face while the tape carrier's reverse face is pressed perpendicularly to the semiconductor chip's obverse face with a pressing force of 0.1 to 0.3 N per bump for a compressing time of 1 to 3 seconds to thermally bond them. The temperature mentioned above, i.e., 400 to 450° C. is the temperature of the tool for heating the semiconductor chip's reverse face, so that temperature of inner leads 14 is lower by about 20 to 50° C. than the former.

When a heating tool of a continuous heating type is used, about 1 second is enough for the compressing time. When a heating tool of a pulsing heating type is used, 2 to 3 seconds are needed since it takes time to raise the temperature.

In the above case, inner lead 14 is specified to be 10 to 25 $\mu$m wide. If the width is greater than this, inner lead 14 cannot penetrate into gold bump 3 sufficiently enough. The width of 10 $\mu$m or smaller is unsuitable in view of fabrication precision and also because too thin inner leads are likely to bend and hence unlikely to penetrate into the bumps. The bonding should be implemented so that inner leads 14 will penetrate into gold bumps 3 by 1 to 7 $\mu$m.

As shown in FIG. 4, the spacing created between semiconductor chip 1 and tape carrier 16 after the connection of bumps 3 with inner leads 14 of the tape carrier is filled up with an underfill resin 11 after bonding of semiconductor chip 1 to tape carrier 16 to encapsulate the device so as to improve the humidity resistance and mechanical strength.

The area other than outer leads 13 on tape carrier 16 is applied with an insulating material, referred to as solder resist 10, so as to prevent some foreign electric conductive materials from directly abutting the pattern and short-circuiting. The thus finished COF 15 is punched out from tape carrier 16, then outer leads 13 of tape carrier 16 are connected to the liquid crystal panel by ACF bonding to complete a liquid crystal module.

In this way, since the present invention makes it possible to use a tape carrier which is obtained by a single gold plating process for the entire surface without using any tape carrier which is prepared by a two separate plating process using two kinds of metals, the tape carrier can be formed in a lower number of processing steps to thereby sharply reduce the cost and delivery period of fabrication of COF semiconductor devices. Further, since tin plating is replaced by gold plating, occurrence of hollowness of the interconnect pattern at the edge of the resist deposition on the interconnect pattern, can be avoided. Particularly, it was confirmed that fine-pitch lead products with approximate 50 m pitch leads did not present disconnection failures in the thermal cycling test, making it possible to prove the improvement in quality and reliability. Moreover, it was also confirmed that the strength of ACF bonding in the gold-plated configuration was enhanced compared to that in the tin-plated configuration.

According to the COF of the present invention, since the semiconductor chip and the inner leads of the tape carrier are joined by gold-gold bonding, it is possible to use a tape carrier which is obtained by a single gold plating process for the entire surface, whereby the tape carrier can be formed in a lower number of steps and hence can be fabricated with a sharply reduced cost in a shortened delivery period. Further, since tin plating is replaced by gold plating, occurrence of hollowness of the interconnect pattern at the edge of the resist deposition on the interconnect pattern, can be avoided and it is possible to improve the quality and reliability of even fine-pitch lead products.

What is claimed is:

1. A tape carrier type semiconductor device, comprising:

a semiconductor chip having connecting bumps formed on the obverse side thereof;

a tape carrier comprising a tape substrate and an interconnect pattern, including connecting inner leads, formed on the tape substrate, the obverse side of the semiconductor chip being totally covered by the tape substrate while the bumps and the inner leads are bonded to each other, wherein the bumps comprise gold and the inner leads are gold plated so that the bumps comprising gold and the inner leads are thermally compression-bonded to each other and the inner leads penetrate into the corresponding bumps comprising gold to create bonding, and wherein portions of the inner leads which are bonded to and penetrate into the bumps comprising gold have a width of from 10 to 35 $\mu$m.

2. The tape carrier type semiconductor device according to claim 1, wherein the inner leads comprise nickel plating over copper interconnections, and gold plating over the nickel plating.

3. The tape carrier type semiconductor device according to claim 2, wherein the thickness of the nickel plating ranges from 0.1 to 1.0 $\mu$m and the thickness of the gold plating ranges from 0.05 to 3.0 $\mu$m.

4. The tape carrier type semiconductor device according to claim 1, wherein solder resists are formed in part on the tape carrier and the interconnect pattern other than that covered by the solder resists is gold plated.

5. The tape carrier type semiconductor device according to claim 1, wherein the space between the semiconductor chip and the tape carrier is filled up with a resin so as to encapsulate the bonded portion of the semiconductor chip and the tape carrier.

6. A liquid crystal module which is connected to a tape carrier type semiconductor device which comprises:

a semiconductor chip having connecting bumps, a tape carrier comprising a tape substrate and an interconnect pattern, including connecting inner leads, formed on the tape substrate, the obverse side of the semiconductor chip being totally covered by the tape substrate while the bumps and the inner leads are bonded to each other, wherein the bumps comprise gold and the inner leads are gold plated so that the bumps and inner leads are thermally compression-bonded to each other and the inner leads penetrate into the corresponding bumps comprising gold to create bonding, and wherein the inner leads further comprise nickel plating provided between copper and the gold plating of the inner leads, and wherein portions of the inner leads which are bonded to and penetrate into the bumps comprising gold have a width of from 10 to 35 $\mu$m.

7. The liquid crystal module according to claim 6, wherein the inner leads comprise nickel plating over copper interconnections, and gold plating over the nickel plating.

8. The liquid crystal module according to claim 6, wherein the connected tape carrier type semiconductor device is characterized in that the inner leads are formed by plating nickel as an undercoating over the copper interconnections and subsequently plating gold over the nickel plating and that the thickness of the nickel plating ranges from 0.1 to 1.0 $\mu$m and the thickness of the gold plating ranges from 0.05 to 3.0 $\mu$m.

9. The liquid crystal module according to claim 6, wherein the connected tape carrier type semiconductor device is characterized in that solder resists are formed in part on the tape carrier and the interconnect pattern other than that covered by the solder resists is gold plated.

10. The liquid crystal module according to claim 6, wherein the connected tape carrier type semiconductor device is characterized in that the inner leads are formed by plating nickel as an undercoating over the copper interconnections and subsequently plating gold over the nickel plating and that solder resists are formed in part on the tape carrier and the interconnect pattern other than that covered by the solder resists is gold plated.

11. The liquid crystal module according to claim 6, wherein the connected tape carrier type semiconductor device is characterized in that the space between the semiconductor chip and the tape carrier is filled up with a resin so as to encapsulate the bonded portion of the semiconductor chip and the tape carrier.

12. The liquid crystal module according to claim 6, wherein the connected tape carrier type semiconductor device is characterized in that the inner leads are formed by plating nickel as an undercoating over the copper interconnections and subsequently plating gold over the nickel plating and that the space between the semiconductor chip and the tape carrier is filled up with a resin so as to encapsulate the bonded portion of the semiconductor chip and the tape carrier.

13. The liquid crystal module according to claim 6, wherein the connected tape carrier type semiconductor device is characterized in that the portions of the inner leads which are to be thermally compression-bonded and connected to the gold bumps have a width of 10 to 35 $\mu$m.

* * * * *